United States Patent
Li et al.

(10) Patent No.: US 10,629,124 B2
(45) Date of Patent: Apr. 21, 2020

(54) PIXEL DRIVING CIRCUIT, PIXEL DRIVING METHOD, ARRAY SUBSTRATE AND DISPLAY PANEL

(71) Applicant: BOE TECHNOLOGY GROUP CO., LTD., Beijing (CN)

(72) Inventors: Quanhu Li, Beijing (CN); Yongqian Li, Beijing (CN); Pan Xu, Beijing (CN); Yu Wang, Beijing (CN); Song Meng, Beijing (CN); Fei Yang, Beijing (CN); Baoxia Zhang, Beijing (CN); Cuili Gai, Beijing (CN); Ling Wang, Beijing (CN); Yicheng Lin, Beijing (CN); Kun Cao, Beijing (CN); Longyan Wang, Beijing (CN); Yue Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 67 days.

(21) Appl. No.: 15/570,928

(22) PCT Filed: May 19, 2017

(86) PCT No.: PCT/CN2017/084992
§ 371 (c)(1),
(2) Date: Oct. 31, 2017

(87) PCT Pub. No.: WO2018/054076
PCT Pub. Date: Mar. 29, 2018

(65) Prior Publication Data
US 2019/0051243 A1    Feb. 14, 2019

(30) Foreign Application Priority Data
Sep. 26, 2016    (CN) .......................... 2016 1 0848955

(51) Int. Cl.
G09G 3/3258 (2016.01)
G09G 3/3233 (2016.01)
G09G 3/20 (2006.01)
H01L 27/32 (2006.01)
G09G 3/3275 (2016.01)
(Continued)

(52) U.S. Cl.
CPC ......... *G09G 3/3258* (2013.01); *G09G 3/2003* (2013.01); *G09G 3/3225* (2013.01);
(Continued)

(58) Field of Classification Search
CPC ... G09G 3/32–3291; G09G 2300/0452; G09G 2310/0264; G09G 2310/0297; H01L 27/32–3297
See application file for complete search history.

(56) References Cited

U.S. PATENT DOCUMENTS 9,672,767 B2 * 6/2017 Kim ..................... G09G 3/2074
2010/0271359 A1   10/2010 Takeuchi et al.
(Continued)

FOREIGN PATENT DOCUMENTS

CN    101872594 A    10/2010
CN    103943059 A    7/2014
(Continued)

OTHER PUBLICATIONS

First Office Action for Chinese Patent Application No. 201610848955.1 dated Mar. 28, 2018.
(Continued)

*Primary Examiner* — Gene W Lee
(74) *Attorney, Agent, or Firm* — Calfee, Halter & Griswold LLP (57) ABSTRACT

A pixel driving circuit, a pixel driving method, an array substrate, a display device, and a display panel are disclosed.
(Continued)

The pixel driving circuit includes a switching subcircuit, a plurality of clock signal lines, a data writing subcircuit and a driving subcircuit.

20 Claims, 6 Drawing Sheets

(51) Int. Cl.
    *G09G 3/3225*     (2016.01)
    *H01L 51/52*     (2006.01)

(52) U.S. Cl.
    CPC ......... *G09G 3/3233* (2013.01); *G09G 3/3275* (2013.01); *H01L 27/3262* (2013.01); *G09G 2300/0452* (2013.01); *G09G 2300/0814* (2013.01); *G09G 2310/0235* (2013.01); *G09G 2310/0264* (2013.01); *H01L 27/3209* (2013.01); *H01L 51/5234* (2013.01)

(56) References Cited

U.S. PATENT DOCUMENTS

| | | | |
|---|---|---|---|
| 2011/0025669 A1* | 2/2011 | Kwak | G09G 3/3225 345/211 |
| 2013/0140538 A1* | 6/2013 | Fujita | H01L 27/3225 257/40 |
| 2015/0187275 A1 | 7/2015 | Park et al. | |
| 2016/0012774 A1 | 1/2016 | Ohara et al. | |
| 2016/0171926 A1 | 6/2016 | Niu et al. | |
| 2016/0293083 A1* | 10/2016 | Yang | G09G 3/3233 |
| 2017/0018223 A1 | 1/2017 | Li et al. | |
| 2017/0061890 A1* | 3/2017 | Zhou | G09G 3/3266 |

FOREIGN PATENT DOCUMENTS

| | | | | |
|---|---|---|---|---|
| CN | 104269429 A | * | 1/2015 | ............... G09G 3/32 |
| CN | 104269429 A | | 1/2015 | |
| CN | 104409036 A | | 3/2015 | |
| CN | 104599641 A | | 5/2015 | |
| CN | 104751780 A | | 7/2015 | |
| CN | 105304022 A | | 2/2016 | |
| CN | 106157896 A | | 11/2016 | |
| KR | 20090039139 A | | 4/2009 | |

OTHER PUBLICATIONS

Search Report for International Patent Application No. PCT/CN2017/084992 dated Jul. 20, 2017.

* cited by examiner

S710
in a switching phase, transmitting, by the switching subcircuit, the data on the data line to the input terminal of the data writing subcircuit under the control of the gate line S720
in a data writing phase, transmitting, by the data writing subcircuit, the signal inputted from the input terminal of the data writing subcircuit to the control terminal of the driving subcircuit under the control of the clock signal line S730
in a light emitting phase, controlling, by the driving subcircuit, corresponding subpixels to be driven to emit light

PIXEL DRIVING CIRCUIT, PIXEL DRIVING METHOD, ARRAY SUBSTRATE AND DISPLAY PANEL

RELATED APPLICATION

The present application is the U.S. national phase entry of PCT/CN2017/084992, with an international filing date of May 19, 2017, which claims the benefit of Chinese Patent Application No. 201610848955.1, filed on Sep. 26, 2016, the entire disclosures of which are incorporated herein by reference.

FIELD

The present disclosure generally relates to the field of display technology. Particularly, the present disclosure relates to a pixel driving circuit, a pixel driving method, an array substrate, a display panel comprising the array substrate, and a display device.

BACKGROUND

An organic light emitting diode (OLED) display is a technology that realizes display using reversible discoloration generated by an organic semiconductor material under the driving of current. The OLED display is considered as the most promising new-generation display technology due to its advantages such as being ultralight and ultrathin, having high brightness, large viewing angle, low voltage, low power consumption, quick response and high resolution, being aseismic and bendable, having low cost and simple process, using less raw material, having high luminous efficiency and wide temperature range, and the like.

In terms of different driving manners, OLED displays can be classified into passive matrix OLED (PMOLED) displays and active matrix OLED (AMOLED) displays. Each light emitting unit of an AMOLED display is independently controlled by a thin film transistor (TFT). Compared to the PMOLED display, the AMOLED display attracts more attention due to its advantages such as having high brightness, high resolution, high efficiency and low power consumption, being easy to improve integration and miniaturization, being easy to realize large-area display, and so on.

At present, an important indicator for evaluating the performance of a display is the number of pixels per inch (PPI). The higher the PPI value of the display is, the higher the density at which the display can display an image is. Certainly, the higher the density of display is, the higher the fidelity is, and the more detailed the image is. In existing OLED displays, as the number of pixels per unit area becomes larger and larger, the number of signal lines of the pixel driving circuit will be multiplied. Since the pixel driving circuit is usually arranged in a frame portion of the OLED display, the increase in the number of signal lines means that the wiring complexity as well as the area of the pixel driving circuit are increased, which will seriously hinder the frame narrowing and thinning of the display device.

SUMMARY

It is an objective of the present disclosure to provide a pixel driving circuit, a pixel driving method, an array substrate, and a display panel comprising the array substrate, and a display device, which can at least partially alleviate or eliminate one or more of the above-mentioned problems in the prior art.

According to an aspect of the present disclosure, there is provided a pixel driving circuit comprising a switching subcircuit, a plurality of clock signal lines, a data writing subcircuit, and a driving subcircuit. A control terminal of the switching subcircuit is connected to a gate line, an input terminal of the switching subcircuit is connected to a data line, and an output terminal of the switching subcircuit is connected to a plurality of input terminals of the data writing subcircuit. A plurality of control terminals of the data writing subcircuit are connected to corresponding clock signal lines, respectively, and a plurality of output terminals of the data writing subcircuit are connected to a plurality of control terminals of the driving subcircuit. A plurality of input terminals of the driving subcircuit are connected to a power line, and a plurality of output terminals of the driving subcircuit are connected to corresponding subpixels to be driven, respectively.

In the above-described pixel driving circuit, the clock signal lines are configured to strobe corresponding subpixels so that it is possible to prevent the situation that each subpixel is strobed by a gate scanning signal and signals are written via different data lines, which will burden data driving especially for high-resolution display. When the above-described pixel driving circuit is applied to an array substrate, clock signal lines can be shared between different pixel driving circuits, thereby significantly reducing the number of signal lines of the overall pixel driving circuit, decreasing the wiring complexity of the signal lines, saving the wiring space of the signal lines, and facilitating miniaturization and thinning of the display device.

In some embodiments, the switching subcircuit comprises a first transistor, wherein a gate of the first transistor is connected to the gate line, a first terminal of the first transistor is connected to the data line, and a second terminal of the first transistor is connected to a corresponding input terminal of the data writing subcircuit.

In some embodiments, the data writing subcircuit comprises a plurality of second transistors, wherein a gate of each second transistor is connected to a corresponding clock signal line, a first terminal of each second transistor is connected to the output terminal of the switching subcircuit, and a second terminal of each second transistor is connected to a corresponding control terminal of the driving subcircuit.

In some embodiments, the driving subcircuit comprises a plurality of third transistors, wherein a gate of each third transistor is connected to a corresponding output terminal of the data writing subcircuit, a first terminal of each third transistor is connected to the power line, and a second terminal of each third transistor is connected to a corresponding subpixel to be driven.

In some embodiments, the subpixels to be driven include a first color subpixel, a second color subpixel, and a third color subpixel. The pixel driving circuit includes three clock signal lines. In such embodiments, the data writing subcircuit comprises three input terminals, three control terminals and three output terminals, and the driving subcircuit comprises three control terminals, three input terminals and three output terminals. For example, the first color subpixel, the second color subpixel, and the third color subpixel may be a red subpixel, a green subpixel, and a blue subpixel, respectively.

It is to be noted that, since a source and a drain of a transistor are symmetrical, in order to distinguish the two terminals other than a gate of the transistor, one of them is called a first terminal and the other is called a second terminal herein.

According to another aspect of the present disclosure, there is provided a pixel driving method using any of the pixel driving circuits described above, wherein one frame period includes one active level period of the gate line, and during the active level period of the gate line, the plurality of clock signal lines are loaded with an active level successively. The above pixel driving method comprises: in a switching phase, transmitting, by the switching subcircuit, a signal on the data line to the input terminal of the data writing subcircuit under the control of the gate line; in a data writing phase, transmitting, by the data writing subcircuit, a signal inputted from the input terminal of the data writing subcircuit to the control terminal of the driving subcircuit under the control of the clock signal line; and in a light emitting phase, controlling, by the driving subcircuit, the corresponding subpixels to be driven to emit light.

In the above-described pixel driving method, a plurality of subpixels are driven synchronously in one frame period.

According to a further aspect of the present disclosure, there is provided a pixel driving method using any of the pixel driving circuits described above, wherein one frame period includes a plurality of subframe periods, each of the subframe periods includes one or more active level periods of the gate line, and the plurality of clock signal lines are loaded with an active level successively during the active level periods of the gate line. The above pixel driving method comprises: in a switching phase, transmitting, by the switching subcircuit, a signal on the data line to the input terminal of the data writing subcircuit under the control of the gate line; in a data writing phase, transmitting, by the data writing subcircuit, a signal inputted from the input terminal of the data writing subcircuit to the control terminal of the driving subcircuit under the control of the clock signal line; and in a light emitting phase, controlling, by the driving subcircuit, the corresponding subpixels to be driven to emit light.

In the above-described pixel driving method, a plurality of subpixels are driven asynchronously in a plurality of subframe periods of one frame period, and the active level periods of the gate line are in one-to-one correspondence to the subpixels.

As used herein, the active level period of the gate line refers to a period during which the gate line is loaded with a level that turns on the switching subcircuit so as to load the signal on the data line to the data writing subcircuit. For example, when the switching subcircuit comprises a first transistor and the gate of the first transistor is connected to the gate line, the active level period of the gate line refers to a period during which the gate line is loaded with a level (which is for example a low level in the case of a P-type transistor and a high level in the case of an N-type transistor) that turns on the first transistor.

As used herein, the active level of the clock signal line refers to a level that turns on the data writing subcircuit so as to load the signal on the data line to the driving subcircuit. For example, when the data writing subcircuit comprises a plurality of second transistors and the gate of each of the second transistors is connected to a corresponding clock signal line, the active level of the clock signal line refers to a level (which is for example a low level in the case of a P-type transistor and a high level in the case of an N-type transistor) that turns on a corresponding second transistor.

According to yet another aspect of the present disclosure, there is provided an array substrate comprising a plurality of pixel structures, and any of the above pixel driving circuits for driving the pixel structures. The pixel structure comprises a plurality of subpixels for emitting light of different colors, and subpixels in the plurality of pixel structures for emitting light of the same color are controlled by the same clock signal line.

In such an array substrate, the clock signal lines are configured to strobe corresponding subpixels so that it is possible to prevent the situation that each subpixel is strobed by a gate scanning signal and signals are written via different data lines, which will burden data driving especially for high-resolution display. As a result, the clock signal lines can be shared between different pixel driving circuits, thereby significantly reducing the number of signal lines of the overall pixel driving circuit, decreasing the wiring complexity of the signal lines, saving the wiring space of the signal lines, and facilitating miniaturization and thinning of the display device.

In some embodiments, the pixel structure comprises a plurality of stacked subpixels for emitting light of different colors. Each subpixel comprises an anode, a cathode, and an organic light emitting layer sandwiched between the anode and the cathode.

In a color OLED display, in order to realize color display, multiple colors must be provided simultaneously at the same pixel position of the display. In the prior art, one pixel of the OLED display includes a plurality of subpixels for emitting light of different colors, which are arranged side by side in space. In order to increase the PPI of the color OLED display, there is a need to reduce the size of pixel. Since the highest precision of the fine mask used for the preparation of the OLED is restricted by a variety of factors, it is difficult to further reduce the size of a pixel of the existing OLED display greatly after it has been reduced to a certain extent. Moreover, a finer mask leads to a higher price, which is unfavorable to display manufacturers.

To this end, it is proposed to physically stack a plurality of subpixels of a pixel so that one pixel only occupies the area of one subpixel on a plane, thereby significantly increasing the PPI of the OLED display.

In some embodiments, a plurality of subpixels include green subpixels, red subpixels, and blue subpixels arranged successively in a light exit direction. The inventors have found that the current red OLED, green OLED and blue OLED have different luminous efficiencies, wherein the luminous efficiency of the green OLED is the highest, that of the red OLED is lower, and that of the blue OLED is the lowest. When light passes through the stacked subpixels, it will inevitably be lost to some extent. By arranging the green OLED having the highest luminous efficiency in the lowermost layer, the red OLED having moderate luminous efficiency in the middle layer, and the blue OLED having the lowest luminous efficiency in the uppermost layer, it is possible to make the intensities of light of individual colors uniform.

In some embodiments, an electrode of the pixel structure that is farthest from the light exit direction of the pixel structure comprises a reflective electrode layer, and the remaining electrodes of the pixel structure are made of a transparent conductive material. The reflective electrode layer farthest from the light exit direction of the pixel structure can prevent light from being lost in a direction other than the light exit direction, and other transparent electrodes enable light to be emitted most efficiently from the light exit direction.

In some embodiments, each subpixel includes a first organic layer sandwiched between the anode and the organic light emitting layer, and a second organic layer sandwiched between the organic light emitting layer and the cathode. The first organic layer is composed of at least one of a hole injection layer, a hole transport layer and an electron blocking layer successively, and the second organic layer is composed of at least one of a hole blocking layer, an electron transport layer and an electron injection layer successively.

In some embodiments, the transparent conductive material includes 2,3,6,7,10,11-hexacyano-1,4,5,8,9,12-hexaazatriphenylene(HATCN). HATCN is an organic conductive material, thus when the electrodes of the pixel structure are manufactured using HATCN, it is possible to continuously form all the organic layers other than the reflective electrode layer in one reaction chamber. The manufacturing process of the above scheme is simpler because there is no need to switch back and forth between different reaction chambers to form a plurality of metal layers and organic material layers, as compared to the scheme in which the electrodes of the pixel structure other than the reflective electrode layer are made of a metal or other inorganic conductive materials.

In addition, HATCN is a material that has a relatively deep lowest unoccupied molecular orbital (LUMO), and the LUMO thereof is equivalent to the highest occupied molecular orbital of a conventional organic material. Therefore, HATCN can also act as a charge generation layer, and the resulting holes thereof can transition from HATCN to the HOMO of an adjacent hole transport layer, thereby facilitating light emission of the pixel structure.

In some embodiments, the transparent conductive material includes one or more of a transparent conductive oxide layer and a transparent metal layer.

In some embodiments, all of the cathodes of the pixel structure other than the electrode farthest from the light exit direction of the pixel structure include 2,3,6,7,10,11-hexacyano-1,4,5,8,9,12-hexaazatriphenylene, and all of the anodes other than the electrode farthest from the light exit direction of the pixel structure include one or more of the transparent conductive oxide layer and the transparent metal layer.

In such embodiments, the anode formed by the transparent conductive oxide layer and/or the transparent metal layer can be directly connected to the pixel driving circuit without the need for separately manufacturing a metal or transparent oxide lead, thereby simplifying the signal connection process from the anode of the OLED pixel to the pixel driving circuit.

In some embodiments, an insulating layer is included between adjacent electrode layers of the pixel structure. The insulating layer between adjacent electrode layers ensures that there is no electrical crosstalk between subpixels.

In some embodiments, two adjacent subpixels share a common electrode layer, and the common electrode layer acts as an anode or a cathode of one of the two adjacent subpixels while acting as an anode or a cathode of the other subpixel. The common electrode layer can reduce the number of electrode layers of the pixel structure, thereby reducing the thickness of the pixel structure and the manufacturing complexity.

In some embodiments, each subpixel includes at least one non-shared electrode, thereby enabling crosstalk between subpixels to be eliminated.

In a further aspect of the present disclosure, there is provided a display panel comprising any of the array substrates described above.

In a further aspect of the present disclosure, there is provided a display device comprising the above display panel.

It is to be noted that all the aspects of the disclosure have similar or identical example implementations and benefits, which will not be described here for simplicity.

These and other aspects of the present disclosure will be apparent from and elucidated with reference to the embodiments described below.

DETAILED DESCRIPTION

Exemplary embodiments of the present disclosure will be described in detail below with reference to the accompanying drawings. The drawings are illustrative and are not drawn to scale, which are only intended to illustrate the embodiments of the present disclosure rather than limiting the scope of the present disclosure. In the drawings, the same reference numerals denote the same or similar parts. In order to clarify the technical solution of the present disclosure, the process steps and device structures well known in the art are omitted here.

Hereinafter, the present disclosure will be described based on the example of an RGB pixel including a red (R) subpixel, a blue (B) subpixel, and a green (G) subpixel. However, as will be appreciated by those skilled in the art, the present disclosure is not limited to the RGB pixel structure, but may equally apply to a pixel structure including other numbers and types of subpixels.

Figure 1:
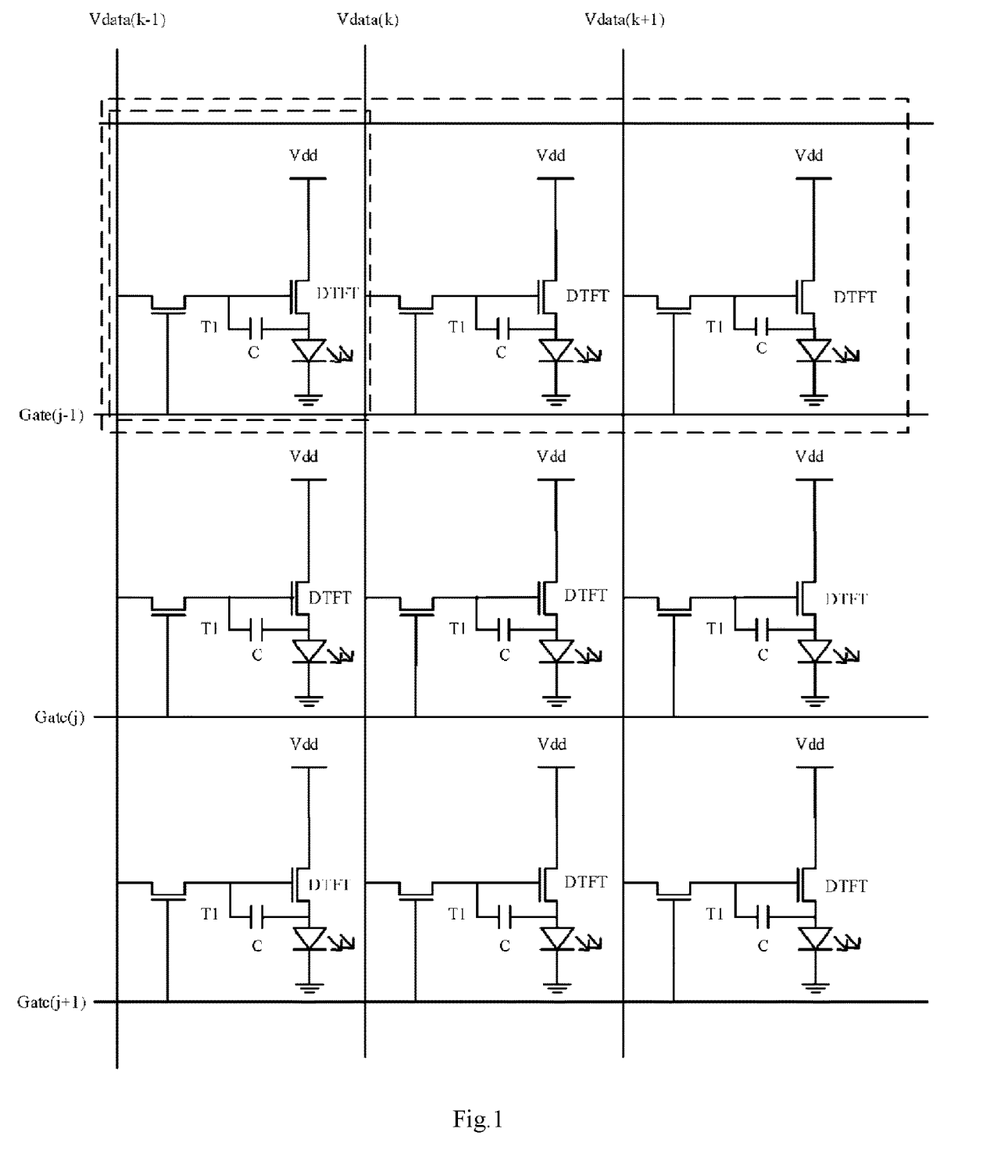
FIG. 1 schematically illustrates a schematic view of an array of a pixel driving circuit according to the prior art.

FIG. 1 schematically illustrates a schematic view of an array of a pixel driving circuit of an AMOLED display according to the prior art. In FIG. 1, each pixel 1 includes three subpixels 11, i.e. a red (R) subpixel, a blue (B) subpixel, and a green (G) subpixel. As shown in FIG. 1, a typical subpixel driving circuit for driving the organic light emitting diode OLED of each subpixel 11 to emit light comprises: a switching transistor T1, a driving transistor DTFT, and a storage capacitor C. The gate of the driving transistor DTFT is connected to the drain of the switching transistor T1 and one terminal of the storage capacitor C, the source of the driving transistor DTFT is connected to a high voltage signal terminal Vdd and the other terminal of the storage capacitor C, and the drain of the driving transistor DTFT is connected to one terminal of the organic light emitting diode OLED. The gate of the switching transistor T1 is connected to a gate line Gate(j), and the source of the switching transistor T1 is connected to a data line Vdata(k). The data writing process employs a line-by-line scan mode, which first loads an active signal on a first gate line Gate (j−1) to strobe the switching transistors T1 of all the subpixels on the (j−1)-th row so as to further load the signal on each data line Vdata to the gate of the driving transistor DTFT of a corresponding subpixel on the (j−1)-th row, and then loads an active signal on a second gate line Gate(j) to strobe all the subpixels on the j-th row via corresponding switching transistors T1 so as to further load the signal on each data line Vdata to the gate of the driving transistor DTFT of a corresponding subpixel on the j-th row, and so on. When other rows are strobed, on the previously strobed rows, Vdata will remain on the gate of the driving transistor DTFT due to the presence of the storage capacitor C. As can be seen from FIG. 1, the overall pixel driving circuit of an m*n pixel array will require (3n+m) signal lines, where m is the number of rows of the pixel array and n is the number of columns of the pixel array.

Figure 2:
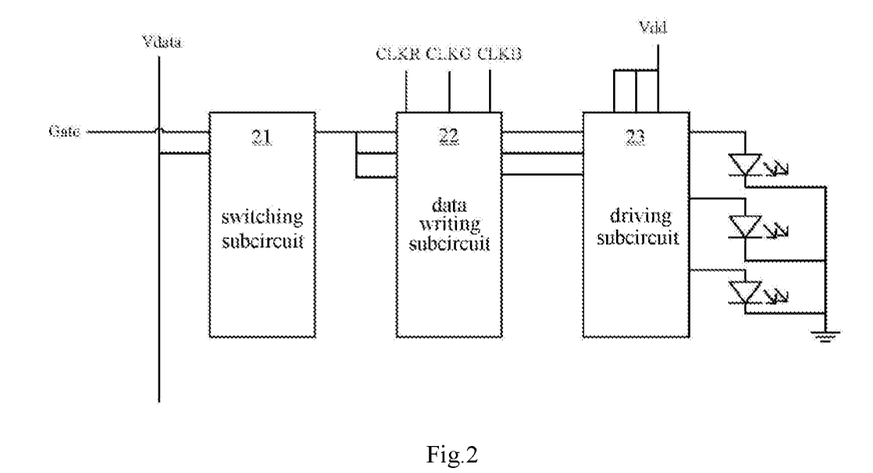
FIG. 2 schematically illustrates a block diagram of a pixel driving circuit according to embodiments of the present disclosure.

To reduce the number of signal lines of the pixel driving circuit, the present disclosure provides a pixel driving circuit. As shown in FIG. 2, the pixel driving circuit comprises a switching subcircuit 21, a plurality of clock signal lines CLKR, CLKG, CLKB, a data writing subcircuit 22, and a driving subcircuit 23. A control terminal of the switching subcircuit 21 is connected to a gate line Gate, an input terminal of the switching subcircuit 21 is connected to a data line Vdata, and an output terminal of the switching subcircuit 21 is connected to a plurality of input terminals of the data writing subcircuit 22. A plurality of control terminals of the data writing subcircuit 22 are connected to corresponding clock signal lines CLKR, CLKG, CLKB, respectively, and a plurality of output terminals of the data writing subcircuit 22 are connected to a plurality of control terminals of the driving subcircuit 23. A plurality of input terminals of the driving subcircuit 23 are connected to a power line Vdd, and a plurality of output terminals of the driving subcircuit 23 are connected to corresponding subpixels to be driven, respectively. The switching subcircuit 21 is configured to transmit a signal on the data line Vdata to the input terminal of the data writing subcircuit 22 under the control of the gate line Gate. The data writing subcircuit 22 is configured to transmit the signal inputted from the input terminal of the data writing subcircuit 22 to the control terminal of the driving subcircuit 23 under the control of the clock signal lines CLKR, CLKG, CLKB. The driving subcircuit 23 is configured to control the corresponding subpixels to be driven to emit light.

In the embodiment shown in FIG. 2, the clock signal lines are used to strobe corresponding subpixels. The clock signal lines CLKR, CLKG, CLKB can be shared between different pixel driving circuits, thereby greatly decreasing the number of signal lines of the overall pixel driving circuit, reducing the wiring complexity of the signal lines, saving the wiring space of the signal lines, and facilitating miniaturization and thinning of the display device.

As compared to the prior art pixel driving circuit array shown in FIG. 1, in embodiments of the present disclosure, the number of signal lines required by the overall pixel driving circuit of the m*n pixel array is (m+n+h), wherein m is the number of rows of the pixel array, n is the number of columns of the pixel array, and h is the number of clock signal lines. In the case of an RGB pixel array, h=3.

Figure 3:
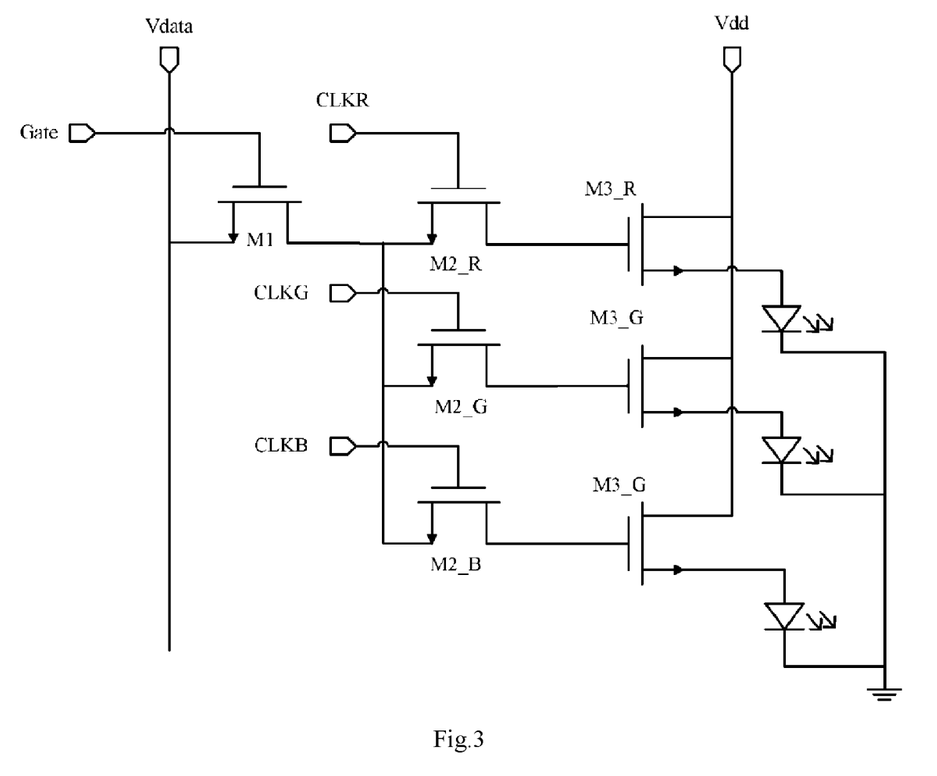
FIG. 3 schematically illustrates a circuit diagram of a pixel driving circuit according to embodiments of the present disclosure.

Specifically, as shown in FIG. 3, the switching subcircuit 21 comprises a first transistor M1, the data writing subcircuit 22 comprises a plurality of second transistors M2_R, M2_G, M2_B, and the driving subcircuit 23 comprises a plurality of third transistors M3_R, M3_G, M3_B. A gate of the first transistor M1 is connected to a gate line Gate, a first terminal of the first transistor M1 is connected to a data line Vdata, and a second terminal of the first transistor M1 is connected to first terminals of the second transistors M2_R, M2_G, M2_B. Gates of the second transistors M2_R, M2_G, M2_B are connected to corresponding clock signal lines CLKR, CLKG, CLKB, respectively, and second terminals of the second transistors M2_R, M2_G, M2_B are connected to gates of the corresponding third transistors M3_R, M3_G, M3_B, respectively. First terminals of the third transistors M3_R, M3_G, M3_B are connected to a power line Vdd, and the second terminals of the third transistors M3_R, M3_G, M3_B are connected to the corresponding subpixels to be driven, respectively.

As used herein, the clock signal line refers to a signal line that applies a control signal to all the corresponding subpixels, rather than a wire that connects the subpixel to the signal line. Taking the clock signal line CLKR in FIG. 3 as an example, it is configured to apply a control signal to all the red subpixels of the display device.

Figure 4:
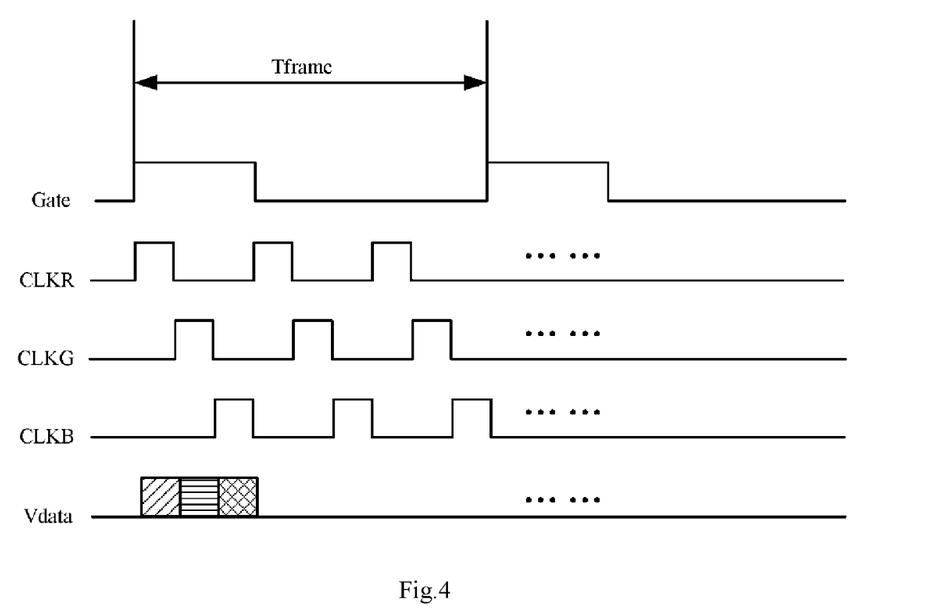
FIG. 4 schematically illustrates a timing diagram of a pixel driving method according to embodiments of the present disclosure.

FIG. 4 illustrates a timing diagram of a driving method for the above-described pixel driving circuit. As shown in FIG. 4, one frame period Tframe includes one active level period of the gate line, and the active level of the gate line is shown in FIG. 4 as a high level. The plurality of clock signal lines are loaded with an active level successively during the active level period of the gate line, while the clock signal lines are not loaded with an active level during other periods of the frame period. Since data to which multiple subpixels correspond is written within one active level period of the gate line during one frame period, this driving method is referred to herein as synchronous driving.

Figure 5:
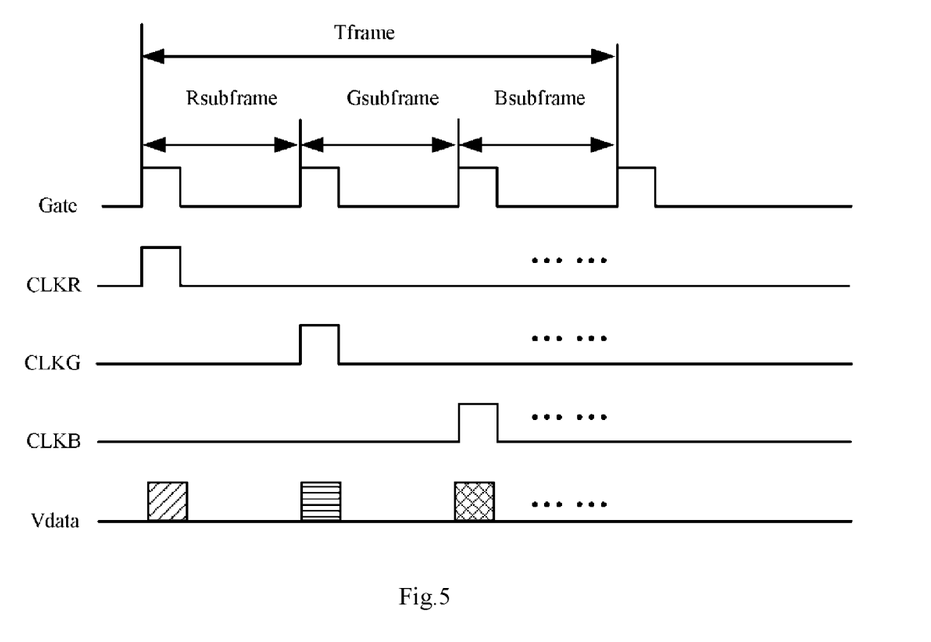
FIG. 5 schematically illustrates a timing diagram of a pixel driving method according to embodiments of the present disclosure.

FIG. 5 illustrates a timing diagram of another driving method for the above-described pixel driving circuit. As shown in FIG. 5, one frame period Tframe includes a plurality of subframe periods Rsubframe, Gsubframe and Bsubframe, each of which includes one active level period of the gate line. The active level of the gate line is shown in FIG. 5 as a high level. The plurality of clock signal lines are loaded with an active level successively during multiple active level periods of the gate line, while the clock signal lines are not loaded with an active level during other periods of the frame period. Since data to which multiple subpixels correspond is written within the multiple active level periods of the gate line during one frame period, this driving method is referred to herein as asynchronous driving.

Figure 6:
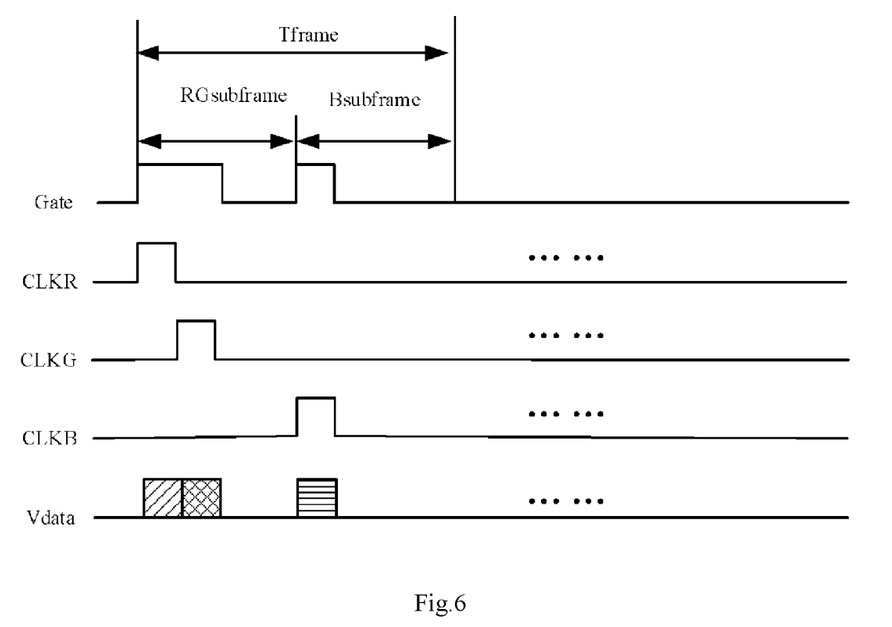
FIG. 6 schematically illustrates a timing diagram of a pixel driving method according to embodiments of the present disclosure.

Alternatively, FIG. 6 illustrates a timing diagram of a further driving method for the above-described pixel driving circuit. As shown in FIG. 6, one frame period Tframe includes a plurality of subframe periods RGsubframe and Bsubframe. The subframe period RGsubframe includes two active level periods of the gate line, and the subframe period Bsubframe includes one active level period of the gate line. The active level of the gate line is shown in FIG. 6 as a high level. The plurality of clock signal lines are loaded with an active level successively during multiple active level periods of the gate line, and the clock signal lines are not loaded with an active level during other periods of the frame period. Since during one frame period, data to which some subpixels correspond is written within one active level period of the gate line, while input to which other subpixels correspond is written within another active level period of the gate line, this driving method is referred to herein as hybrid driving.

Figure 7:
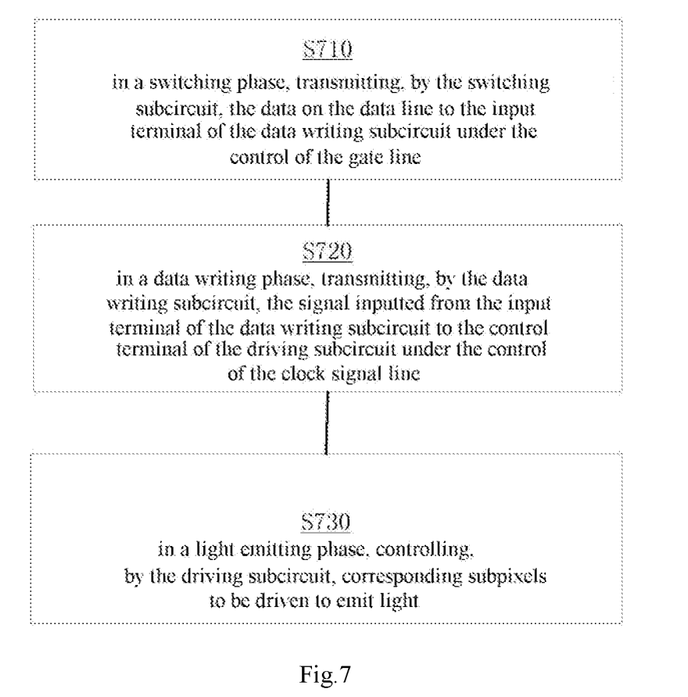
FIG. 7 schematically illustrates a flow chart of a pixel driving method according to embodiments of the present disclosure.

FIG. 7 schematically illustrates a flow chart of the above-described driving method. As shown in FIG. 7, the pixel driving method comprises, in a switching phase S710, transmitting, by the switching subcircuit, the data on the data line to the input terminal of the data writing subcircuit under the control of the gate line; in a data writing phase S720, transmitting, by the data writing subcircuit, the signal inputted from the input terminal of the data writing subcircuit to the control terminal of the driving subcircuit under the control of the clock signal line; and in a light emitting phase S730, controlling, by the driving subcircuit, corresponding subpixels to be driven to emit light.

Figure 8:
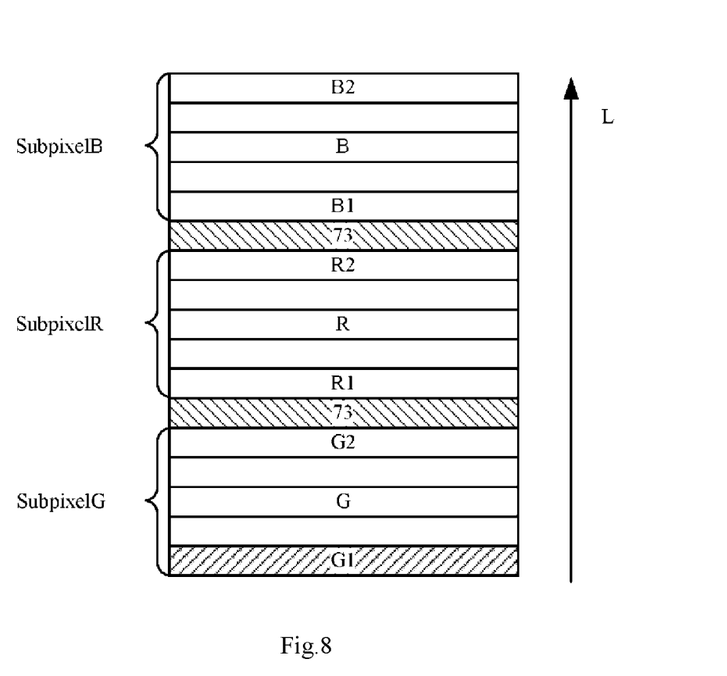
FIGS. 8-11 illustrate a schematic view of a pixel structure according to embodiments of the present disclosure, respectively.

Accordingly, the present disclosure provides an array substrate comprising a plurality of pixel structures, and a plurality of pixel driving circuits described above for driving the plurality of pixel structures. As shown in FIG. 8, the pixel structure comprises green subpixels SubpixelG, red subpixels SubpixelR, and blue subpixels SubpixelB arranged successively in a light exit direction L. Each subpixel comprises an anode, a cathode, an organic light emitting layer sandwiched between the anode and the cathode, a first organic layer sandwiched between the anode and the organic light emitting layer, and a second organic layer sandwiched between the organic light emitting layer and the cathode. The first organic layer is composed of at least one of a hole injection layer, a hole transport layer and an electron blocking layer successively, and the second organic layer is composed of at least one of a hole blocking layer, an electron transport layer and an electron injection layer successively. In addition, an insulating layer 73 is arranged between adjacent electrode layers of the pixel structure.

In the above embodiment, the PPI of the OLED display is significantly increased by physically stacking a plurality of subpixels of a pixel so that one pixel only occupies the area of one subpixel on the plane. In addition, by arranging the green OLED having the highest luminous efficiency in the lowermost layer, the red OLED having moderate luminous efficiency in the middle layer, and the blue OLED having the lowest luminous efficiency in the uppermost layer, it is possible to make the intensities of light of individual colors uniform.

Optionally, an electrode G1 of the pixel structure farthest from the light exit direction L of the pixel structure comprises a reflective electrode layer, and the remaining electrodes G2, R1, R2, B1, B2 of the pixel structure are made of a transparent conductive material. The reflective electrode layer can prevent light from being lost in a direction other than the light exit direction, and other transparent electrodes enable light to be emitted most efficiently from the light exit direction.

For example, the transparent conductive material includes 2,3,6,7,10,11-hexacyano-1,4,5,8,9,12-hexaazatriphenylene. When the electrodes of the pixel structure are manufactured using HATCN, it is possible to continuously form all the organic layers other than the reflective electrode layer in one reaction chamber, so that the manufacturing process is simpler. Moreover, HATCN may also act as a charge generation layer, and the resulting holes may transition from HATCN to the HOMO of an adjacent hole transport layer, thereby facilitating light emission of the pixel structure.

Alternatively, the transparent conductive material includes one or more of a transparent conductive oxide layer and a transparent metal layer.

Optionally, all of the cathodes R1, B1 of the pixel structure other than the electrode G1 farthest from the light exit direction of the pixel structure include 2,3,6,7,10,11-hexacyano-1,4,5,8,9,12-hexaazatriphenylene, and all of the anodes G2, R2, B2 other than the electrode farthest from the light exit direction of the pixel structure include one or more of a transparent conductive oxide layer and a transparent metal layer. Since the anode of the subpixel is typically connected to the output terminal of the pixel driving circuit, the anode formed by the transparent conductive oxide layer and/or the transparent metal layer can be directly connected to the pixel driving circuit without the need for separately manufacturing a metal or transparent oxide lead, thereby simplifying the signal connection process from the anode of the OLED subpixel to the pixel driving circuit.

Figure 9:
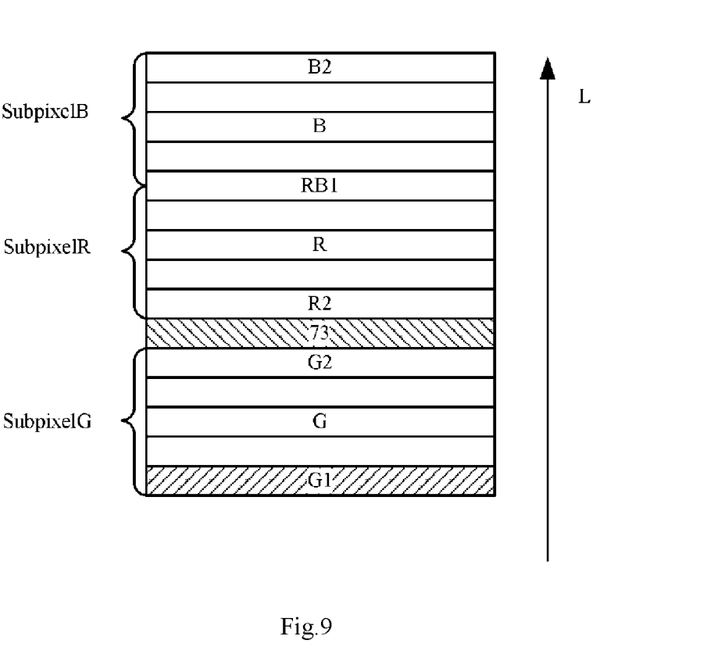

Alternatively, as shown in FIG. 9, adjacent red subpixel SubpixelR and blue subpixel SubpixelB may share a common electrode layer RB1. In such a case, the insulating layer between the red subpixel SubpixelR and the blue subpixel SubpixelB is omitted, and the common electrode layer RB1 acts as the cathode of the red subpixel SubpixelR and the cathode of the blue subpixel SubpixelB.

Figure 10:
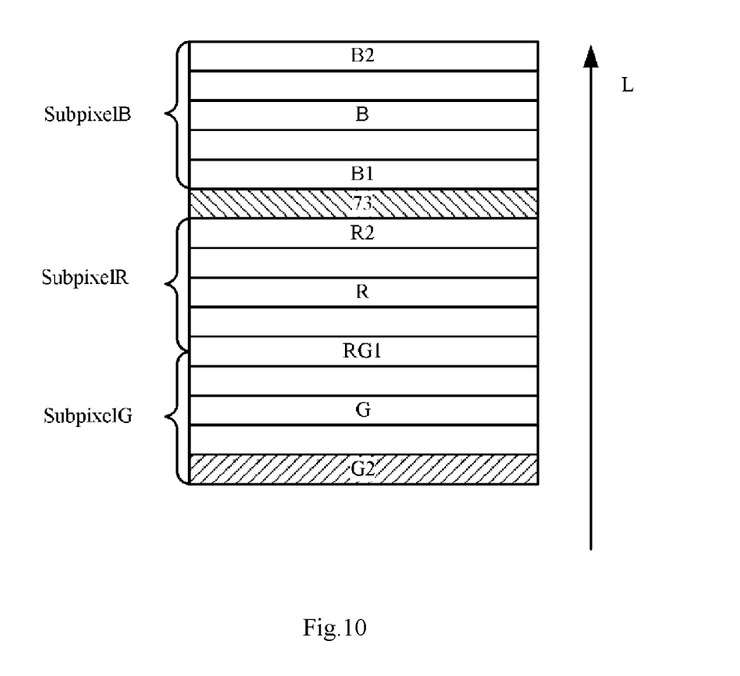

Alternatively, as shown in FIG. 10, adjacent red subpixel SubpixelR and green subpixel SubpixelG may share a common electrode layer RG1. In such a case, the insulating layer between the red subpixel SubpixelR and the green subpixel SubpixelG is omitted, and the common electrode layer RG1 acts as the cathode of the red subpixel SubpixelR and the cathode of the green subpixel SubpixelG.

In order to prevent crosstalk between subpixels, each subpixel still includes at least one non-shared electrode in the case where adjacent two subpixels share a common electrode layer. In this way, each subpixel can be individually controlled to prevent crosstalk between adjacent subpixels. For example, as shown in FIG. 10, adjacent red subpixel SubpixelR and blue subpixel SubpixelB may share a common electrode layer RB1, but the red subpixel SubpixelR, the blue subpixel SubpixelB, and the green subpixel SubpixelG include non-shared electrodes R1, B2, and G1 and G2, respectively. Similarly, as shown in FIG. 10, adjacent red subpixel SubpixelR and green subpixel SubpixelG may share a common electrode layer RG1, but the red subpixel SubpixelR, the blue subpixel SubpixelB, and the green subpixel SubpixelG include non-shared electrodes R2, B1 and B2, and G1, respectively.

Figure 11:
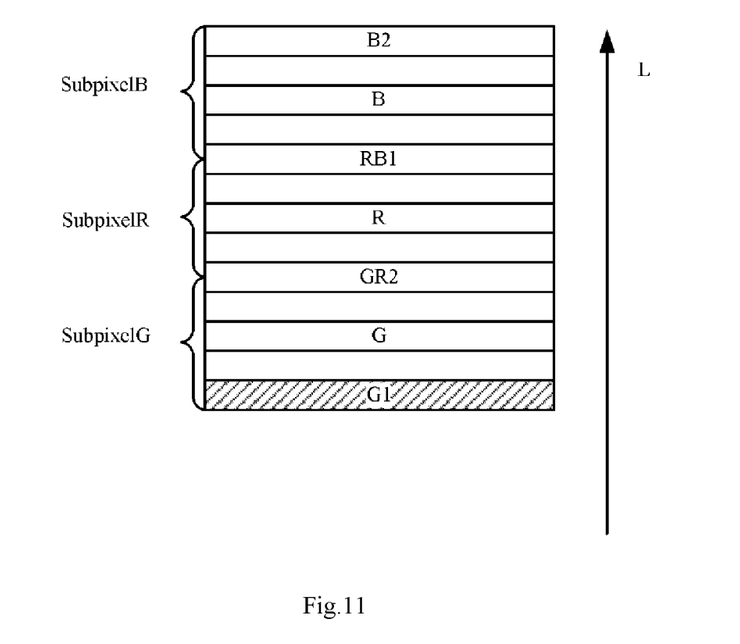

Alternatively, as shown in FIG. 11, adjacent red subpixel SubpixelR and blue subpixel SubpixelB may share a common electrode layer RB1, and adjacent red subpixel SubpixelR and green subpixel SubpixelG may share a common electrode layer GR2. In such a case, the insulating layers between individual subpixels are omitted, the common electrode layer RB1 acts as the cathode of the red subpixel SubpixelR and the cathode of the blue subpixel SubpixelB, and the common electrode layer GR2 acts as the anode of the red subpixel SubpixelR and the anode of the green subpixel SubpixelG.

The conventional pixel driving method may not be applicable to the stacked pixel structure that uses a common electrode layer. In the conventional pixel driving method, each column of subpixels is connected to one data line. When the gate line turns on all the subpixels of one row, data is written into subpixels of different colors at the same time. If a common electrode layer is shared between subpixels, the subpixels sandwiched between two common electrode layers will be subjected to crosstalk of the subpixels stacked therewith, thereby affecting the display effect. In contrast, if the above-described pixel driving method proposed in the present disclosure is used, since subpixels of different colors are turned on at different times and data is written thereto, crosstalk between subpixels can be effectively avoided.

The present disclosure further provides a display panel and a display device comprising any of the array substrates described above.

The concept of the present disclosure can be widely applied to any system having a display function, including a desktop computer, a laptop computer, a mobile phone, a tablet computer, and the like. In addition, although several embodiments have been described in detail above, other modifications are possible. For example, a component may be added to the described system or removed from the described system. Other embodiments may be within the scope of the present disclosure. It will be apparent to those skilled in the art that various modifications and variations can be made without departing from the spirit and scope of the present disclosure in view of the teachings of the present disclosure.

The invention claimed is:

1. An array substrate comprising a plurality of pixel structures and a pixel driving circuit for driving the pixel structures, the pixel structure comprising a plurality of subpixels for emitting light of different colors, subpixels in the plurality of pixel structures for emitting light of a same color being controlled by a same clock signal line,
   wherein the pixel driving circuit comprises a switching subcircuit, a plurality of clock signal lines, a data writing subcircuit, and a driving subcircuit, wherein,
   a control terminal of the switching subcircuit is connected to a gate line, an input terminal of the switching subcircuit is connected to a data line, and an output terminal of the switching subcircuit is connected to a plurality of input terminals of the data writing subcircuit;
   a plurality of control terminals of the data writing subcircuit are connected to corresponding clock signal lines, respectively, and a plurality of output terminals of the data writing subcircuit are connected to a plurality of control terminals of the driving subcircuit in one-to-one correspondence;
   a plurality of input terminals of the driving subcircuit are connected to a power line, and a plurality of output terminals of the driving subcircuit are connected to corresponding subpixels to be driven, respectively,
   wherein an electrode of the pixel structure farthest from the light exit direction of the pixel structure comprises a reflective electrode layer, and remaining electrodes of the pixel structure are made of a transparent conductive material, and the transparent conductive material includes 2,3,6,7,10,11-hexacyano-1,4,5,8,9,12-hexaazatriphenylene.

2. The array substrate according to claim 1, wherein an insulating layer is included between adjacent electrode layers of the pixel structure.

3. The array substrate according to claim 1, wherein two adjacent subpixels share a common electrode layer, and the common electrode layer acts as an anode or a cathode of one of the two adjacent subpixels while acting as an anode or a cathode of the other of the two adjacent subpixels.

4. A display panel comprising the array substrate according to claim 1.

5. A display device comprising the display panel according to claim 4.

6. The array substrate according to claim 1, wherein the switching subcircuit comprises a first transistor, a gate of the first transistor being connected to the gate line, a first terminal of the first transistor being connected to the data line, a second terminal of the first transistor being connected to a corresponding input terminal of the data writing subcircuit.

7. The array substrate according to claim 1, wherein the data writing subcircuit comprises a plurality of second transistors, a gate of each second transistor being connected to a corresponding clock signal line, a first terminal of each second transistor being connected to the output terminal of the switching subcircuit, a second terminal of each second transistor being connected to a corresponding control terminal of the driving subcircuit in one-to-one correspondence.

8. The array substrate according to claim 1, wherein the driving subcircuit comprises a plurality of third transistors, a gate of each third transistor being connected to a corresponding output terminal of the data writing subcircuit in one-to-to correspondence, a first terminal of each third transistor being connected to the power line, a second terminal of each third transistor being connected to a corresponding subpixel to be driven.

9. The array substrate according to claim 1, wherein the subpixels to be driven include a first color subpixel, a second color subpixel, and a third color subpixel, and the pixel driving circuit includes three clock signal lines.

10. The array substrate according to claim 1, wherein the pixel structure comprises a plurality of stacked subpixels for emitting light of different colors, the plurality of subpixels includes green subpixels, red subpixels and blue subpixels arranged successively in a light exit direction, and each of the subpixels comprises an anode, a cathode, and an organic light emitting layer sandwiched between the anode and the cathode.

11. The array substrate according to claim 1, wherein the switching subcircuit comprises a first transistor, a gate of the first transistor being connected to the gate line, a first terminal of the first transistor being connected to the data line, a second terminal of the first transistor being connected to a corresponding input terminal of the data writing subcircuit.

12. The array substrate according to claim 1, wherein the data writing subcircuit comprises a plurality of second transistors, a gate of each second transistor being connected to a corresponding clock signal line, a first terminal of each second transistor being connected to the output terminal of the switching subcircuit, a second terminal of each second transistor being connected to a corresponding control terminal of the driving sub circuit in one-to-one correspondence.

13. The array substrate according to claim 1, wherein the driving subcircuit comprises a plurality of third transistors, a gate of each third transistor being connected to a corresponding output terminal of the data writing subcircuit in one-to-to correspondence, a first terminal of each third transistor being connected to the power line, a second terminal of each third transistor being connected to a corresponding subpixel to be driven.

14. The pixel driving circuit according to claim 1, wherein the subpixels to be driven include a first color subpixel, a second color subpixel, and a third color subpixel, and the pixel driving circuit includes three clock signal lines.

15. An array substrate comprising a plurality of pixel structures and a pixel driving circuit for driving the pixel structures, the pixel structure comprising a plurality of subpixels for emitting light of different colors, subpixels in the plurality of pixel structures for emitting light of a same color being controlled by a same clock signal line, wherein the pixel driving circuit comprises a switching subcircuit, a plurality of clock signal lines, a data writing subcircuit, and a driving subcircuit, wherein, a control terminal of the switching subcircuit is connected to a gate line, an input terminal of the switching subcircuit is connected to a data line, and an output terminal of the switching subcircuit is connected to a plurality of input terminals of the data writing subcircuit;

a plurality of control terminals of the data writing subcircuit are connected to corresponding clock signal lines, respectively, and a plurality of output terminals of the data writing subcircuit are connected to a plurality of control terminals of the driving subcircuit in one-to-one correspondence;

a plurality of input terminals of the driving subcircuit are connected to a power line, and a plurality of output terminals of the driving subcircuit are connected to corresponding subpixels to be driven, respectively, wherein all the cathodes of the pixel structure other than the electrode farthest from the light exit direction of the pixel structure include 2,3,6,7,10,11-hexacyano-1,4,5,8,9,12-hexaazatriphenylene, and all the anodes other than the electrode farthest from the light exit direction of the pixel structure includes one or more of a transparent conductive oxide layer and a transparent metal layer.

16. The array substrate according to claim 15, wherein the pixel structure comprises a plurality of stacked subpixels for emitting light of different colors, the plurality of subpixels includes green subpixels, red subpixels and blue subpixels arranged successively in a light exit direction, and each of the subpixels comprises an anode, a cathode, and an organic light emitting layer sandwiched between the anode and the cathode.

17. The pixel driving circuit according to claim 15, wherein the switching subcircuit comprises a first transistor, a gate of the first transistor being connected to the gate line, a first terminal of the first transistor being connected to the data line, a second terminal of the first transistor being connected to a corresponding input terminal of the data writing subcircuit.

18. The pixel driving circuit according to claim 15, wherein the data writing subcircuit comprises a plurality of second transistors, a gate of each second transistor being connected to a corresponding clock signal line, a first terminal of each second transistor being connected to the output terminal of the switching subcircuit, a second terminal of each second transistor being connected to a corresponding control terminal of the driving sub circuit in one-to-one correspondence.

19. The pixel driving circuit according to claim 15, wherein the driving subcircuit comprises a plurality of third transistors, a gate of each third transistor being connected to a corresponding output terminal of the data writing subcircuit in one-to-to correspondence, a first terminal of each third transistor being connected to the power line, a second terminal of each third transistor being connected to a corresponding subpixel to be driven.

20. The pixel driving circuit according to claim 15, wherein the subpixels to be driven include a first color subpixel, a second color subpixel, and a third color subpixel, and the pixel driving circuit includes three clock signal lines.

* * * * *